United States Patent
Pan

(10) Patent No.: US 8,785,229 B1
(45) Date of Patent: Jul. 22, 2014

(54) METHODS OF FORMING MICRO-ELECTROMECHANICAL RESONATORS HAVING PASSIVE TEMPERATURE COMPENSATION REGIONS THEREIN

(71) Applicant: Integrated Device Technology, Inc., San Jose, CA (US)

(72) Inventor: Wanling Pan, San Jose, CA (US)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 13/898,999

(22) Filed: May 21, 2013

Related U.S. Application Data

(62) Division of application No. 13/035,148, filed on Feb. 25, 2011, now Pat. No. 8,501,515.

(51) Int. Cl.
   *H01L 21/00* (2006.01)
   *H01L 41/00* (2013.01)

(52) U.S. Cl.
   USPC ............ 438/48; 438/406; 438/455; 438/459; 438/476

(58) Field of Classification Search
   USPC ................. 438/48, 406, 455, 458, 459, 476
   See application file for complete search history.

(56) References Cited

U.S. PATENT DOCUMENTS

| | | |
|---|---|---|
| 5,160,901 A | 11/1992 | Stone |
| 5,229,735 A | 7/1993 | Quan |
| 5,640,133 A | 6/1997 | MacDonald et al. |
| 6,557,419 B1 | 5/2003 | Herb et al. |
| 6,604,266 B1 | 8/2003 | Tajima et al. |
| 6,630,871 B2 | 10/2003 | Ma et al. |
| 6,657,363 B1 | 12/2003 | Aigner |
| 6,739,190 B2 | 5/2004 | Hsu et al. |
| 6,870,444 B1 | 3/2005 | Zurcher et al. |
| 7,071,793 B2 | 7/2006 | Lutz et al. |
| 7,176,770 B2 | 2/2007 | Ayazi et al. |
| 7,199,504 B2 | 4/2007 | Komuro et al. |
| 7,202,761 B2 | 4/2007 | Lutz et al. |
| 7,215,061 B2 | 5/2007 | Kihara et al. |
| 7,280,007 B2 | 10/2007 | Feng et al. |
| 7,312,674 B2 | 12/2007 | Duwel et al. |

(Continued)

FOREIGN PATENT DOCUMENTS

| | | |
|---|---|---|
| EP | 1 217 735 A1 | 6/2002 |
| EP | 2 144 369 A1 | 1/2010 |
| WO | WO 2007/072409 A2 | 6/2007 |

OTHER PUBLICATIONS

"Film Bulk Acoustic-Wave Resonator (FBAR)," Admitted Prior Art, http://mems.usc.edu/fbar.htm, Printed from the Internet Oct. 14, 2008, 3 pages.

(Continued)

*Primary Examiner* — Thanh V Pham
(74) *Attorney, Agent, or Firm* — Myers, Bigel, et al.

(57) ABSTRACT

Methods of forming micromechanical resonators include forming first and second substrates having first and second semiconductor layers of first and second conductivity type therein, respectively. The first semiconductor layer of first conductivity type is bonded to the second semiconductor layer of second conductivity type to thereby define a first rectifying junction at an interface of the bonded semiconductor layers. A piezoelectric layer is formed on the first rectifying junction and at least a first electrode is formed on the piezoelectric layer.

9 Claims, 14 Drawing Sheets

(56) References Cited

U.S. PATENT DOCUMENTS

| | | | |
|---|---|---|---|
| 7,446,620 | B2 | 11/2008 | Partridge et al. |
| 7,489,063 | B2 | 2/2009 | Isobe et al. |
| 7,608,980 | B2 | 10/2009 | Kataoka |
| 7,616,077 | B1 | 11/2009 | Wittwer et al. |
| 7,639,104 | B1 | 12/2009 | Quevy et al. |
| 7,675,389 | B2 | 3/2010 | Yamakawa et al. |
| 7,888,843 | B2 | 2/2011 | Ayazi et al. |
| 7,939,990 | B2 | 5/2011 | Wang et al. |
| 2002/0096967 | A1 | 7/2002 | Ma et al. |
| 2005/0146248 | A1 | 7/2005 | Moler et al. |
| 2005/0242904 | A1 | 11/2005 | Lutz et al. |
| 2006/0125576 | A1 | 6/2006 | Ho et al. |
| 2006/0196273 | A1 | 9/2006 | Burns |
| 2006/0225504 | A1 | 10/2006 | Ayazi et al. |
| 2007/0069612 | A1 | 3/2007 | Sato |
| 2007/0188269 | A1 | 8/2007 | Lutz et al. |
| 2007/0220971 | A1 | 9/2007 | Ayazi et al. |
| 2007/0277620 | A1 | 12/2007 | Melamud et al. |
| 2008/0143217 | A1 | 6/2008 | Ho et al. |
| 2008/0186109 | A1 | 8/2008 | Ho et al. |
| 2009/0153267 | A1 | 6/2009 | Lutz et al. |
| 2009/0160581 | A1 | 6/2009 | Hagelin et al. |
| 2009/0194830 | A1* | 8/2009 | Ransley et al. ............... 257/415 |
| 2009/0325385 | A1 | 12/2009 | Tomita et al. |
| 2010/0032789 | A1 | 2/2010 | Schoen et al. |
| 2010/0060384 | A1 | 3/2010 | Taniguchi et al. |
| 2010/0168583 | A1 | 7/2010 | Dausch et al. |
| 2010/0194241 | A1 | 8/2010 | Wang et al. |
| 2010/0319185 | A1 | 12/2010 | Ayazi et al. |
| 2012/0032876 | A1 | 2/2012 | Tabe |

OTHER PUBLICATIONS

"Finite element method," Admitted Prior Art, http://en.wikipedia.org/wiki/Finite_element_method, Printed from the Internet Nov. 3, 2011, 13 pages.
Abdolvand et al., "A Low Voltage Temperature-Stable Micromechanical Piezoelectric Oscillator," *Digest of the 14th International Conference on Solid State Sensors, Actuators and Microsystems* (Transducers '07), Lyon, France, Jun. 2007, pp. 53-56.
Abdolvand et al., "A Temperature-Compensated ZnO-on-Diamond Resonant Mass Sensor," *Proc. 5th IEEE Conference on Sensors*, 2006, pp. 1297-1300.
Abdolvand et al., "Single-Resonator Dual-Frequency Thin-Film Piezoelectric-on-Substrate Oscillator", *IEEE International Electron Devices Meeting*, 2007, pp. 419-422.
Baborowski et al., "Piezoelectrically Activated Silicon Resonators", IEEE Frequency Control Symposium, 2007 Joint with the 21$^{st}$ European Frequency and Time Forum, May 1, 2007, pp. 1210-1213, XP031138158, section I.
Casinovi et al., "Analytical Modeling and Numerical Simulation of Capacitive Silicon Bulk Acoustic Resonators," IEEE International Conference on Micro Electro Mechanical Systems, Jan. 2009, pp. 935-938.
Dubois, Marc-Alexandre., "Thin film bulk acoustic wave resonators: a technology overview," MEMSWAVE 03, Toulouse, France, Jul. 2-4, 2003.
Ho et al., "High Order Composite Bulk Acoustic Resonators," *Proc. 20th IEEE International Conference on Micro Electro Mechanical Systems* (MEMS '07), Kobe, Japan, Jan. 2007, pp. 791-794.
Ho et al., "Temperature Compensated IBAR Reference Oscillators," *Proc. 19th IEEE International Conference on Micro Electro Mechanical System*,(MEMS '06), Istanbul, Turkey, Jan. 2006, pp. 910-913.
Invitation to Pay Additional Fees and, Where Applicable, Protest Fee, PCT/US2010/022510, Jun. 4, 2010.
Jaakkola et al., "Piezoelectrically transduced Single-Crystal-Silicon Plate Resonators," VTT Technical Research Centre of Finland, Finland.
Kim et al., "Temperature Dependence of Quality Factor in MEMS Resonators," Journal of Microelectromechanical Systems, vol. 17, No. 3, Jun. 2008, pp. 755-766.
Kim et al., "Micromechanical Resonant Displacement Gain Stages,"IEEE, 2009, pp. 19-22.
Lin et al., "Series-Resonant VHF Micromechanical Resonator Reference Oscillators," *IEEE Journal of Solid-State Circuits*, vol. 39, No. 12, Dec. 2004, pp. 2477-2491.
Luoto et al., "MEMS on cavity-SOI wafers," Solid State Electronics 51:328-332 (2007).
Nam et al., "Piezoelectric Properties of Aluminum Nitride for Thin Film Bulk Acoustic Wave Resonator," J. Korean Physical Society, 47:S309-S312 (2005).
Notification of Transmittal of the International Search Report and The Written Opinion of the International Searching Authority, or the Declaration, International Search Report, Written Opinion of the International Searching Authority, PCT/US2010/037429, Date of Mailing: Sep. 6, 2010, 28 pages.
Notification of Transmittal of the International Search Report and the Written Opinion of the International Searching Authority, or the Declaration; International Search Report; Written Opinion of the International Searching Authority, PCT Application No. PCT/US2008/010844, Jun. 24, 2009.
Notification of Transmittal of The International Search Report and The Written Opinion of the International Searching Authority, or the Declaration, Written Opinion of the International Searching Authority, International Application No. PCT/US2010/022510, date of mailing Aug. 25, 2010, 19 pages.
Pourkamali et al., "Low-impedance VHF and UHF Capacitive Silicon Bulk Acoustic Wave Resonators—Part I: Concept and Fabrication," IEEE Transaction on Electron Devices, vol. 54, No. 8, Aug. 2007, pp. 2017-2023.
Samarao et al. (2010) "Intrinsic Temperature Compensation of Highly Resistive High-Q Silicon Microresonators Via Charge Carrier Depletion", Frequency Control Symposium (FCS), 2010 IEEE International, Jun. 1-4, 2010, Newport Beach, California, pp. 334-339.
Samarao et al. (2010) "Passive TCF Compensation in High Q Silicon Micromechanical Resonators", IEEE International Conference on Micro Electro Mechanical Systems, Jan. 2010, pp. 116-119.
Schodowski, "Resonator Self-Temperature-Sensing Using a Dual-Harmonic-Mode Crystal Oscillator," *Proc. of the 43rd Annual Symposium on Frequency Control*, Jun. 1989, pp. 2-7.
Schoen et al., "Temperature Compensation in Silicon-Based Micro-Electromechanical Resonators", IEEE Conference on Micro Electromechanical Systems 2009, Jan. 25, 2009, pp. 884-887, XP031444436, figures 1-3.
Sundaresan et al., "A Low Phase Noise 100MHz Silicon BAW Reference Oscillator," *Proc. IEEE Custom Integrated Circuits Conference*, Sep. 2006, pp. 841-844.
Tabrizian R. et al., "Temperature-Stable High-Q ALN-on-Silicon Resonators with Embedded Array of Oxide Pillars", *Solid-State Sensors, Actuators, and Microsystems Workshop*, (Hilton Head 2010), Hilton Head Island, SC, Jun. 2010, pp. 100-101; 2 pages.
Vig, "Dual-mode Oscillators for Clocks and Sensors," *Procs. IEEE Ultrasonics Symposium*, vol. 2, No., 1999, pp. 859-868.

* cited by examiner

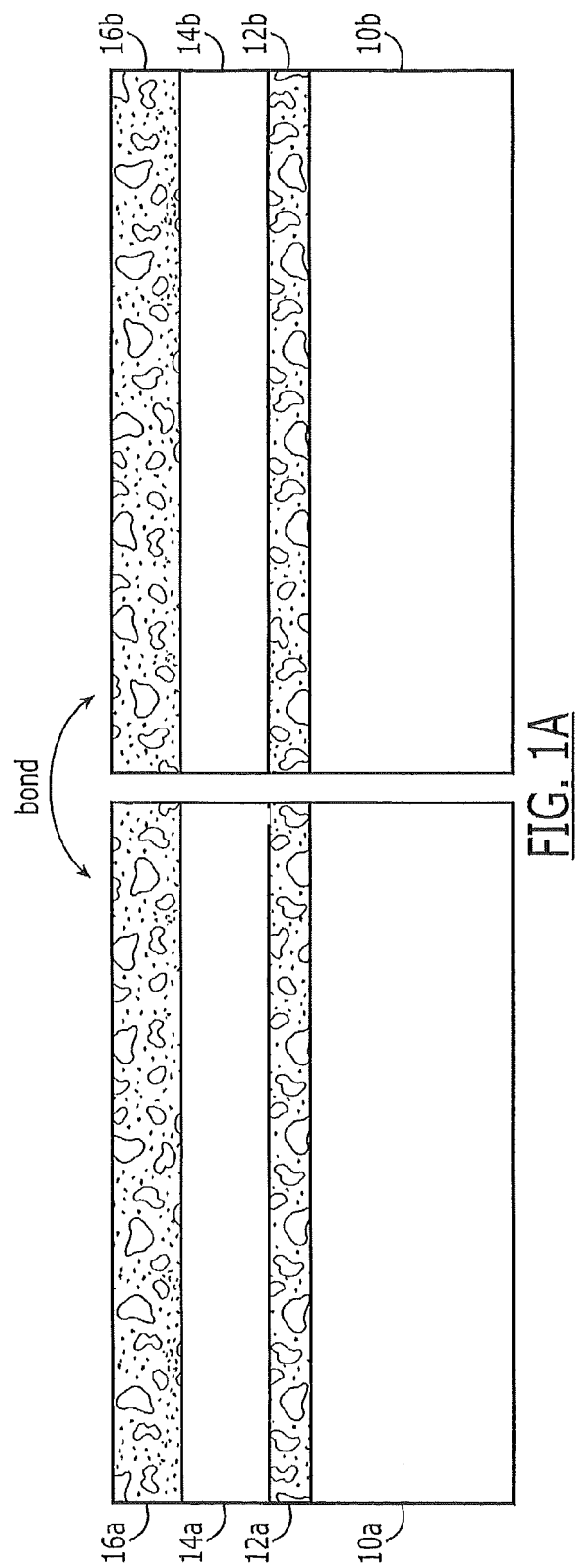

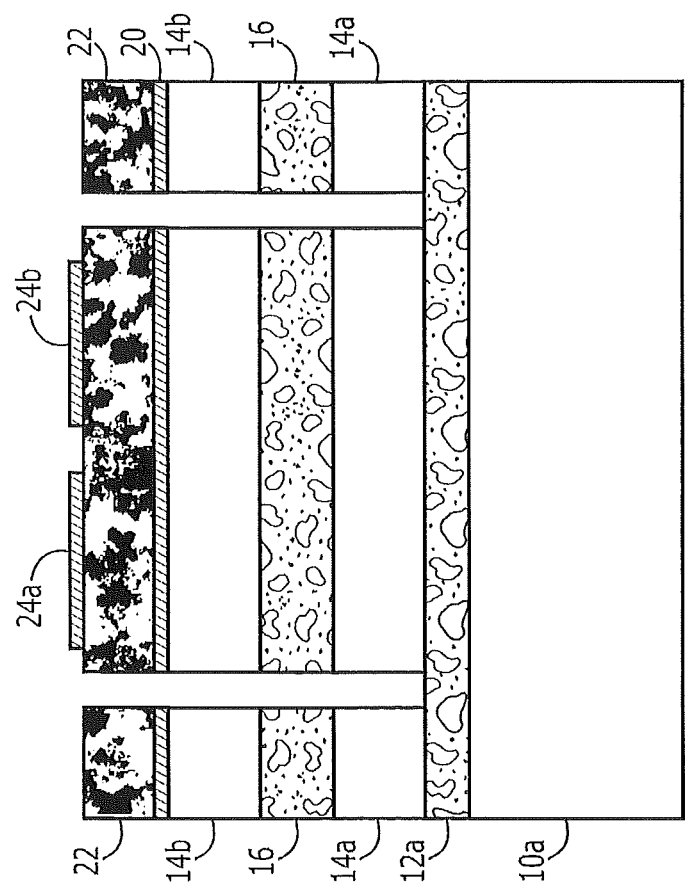

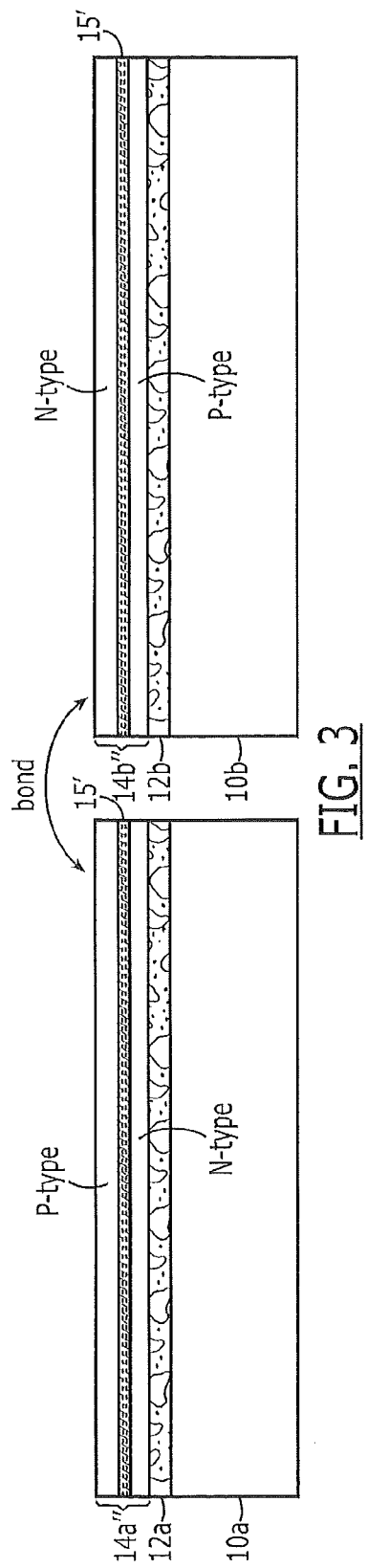

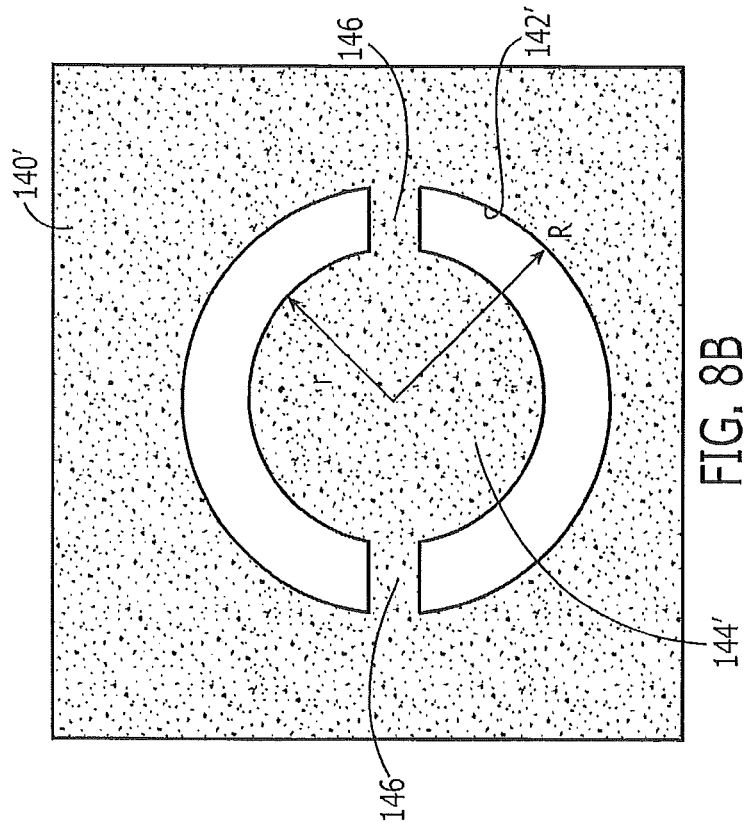
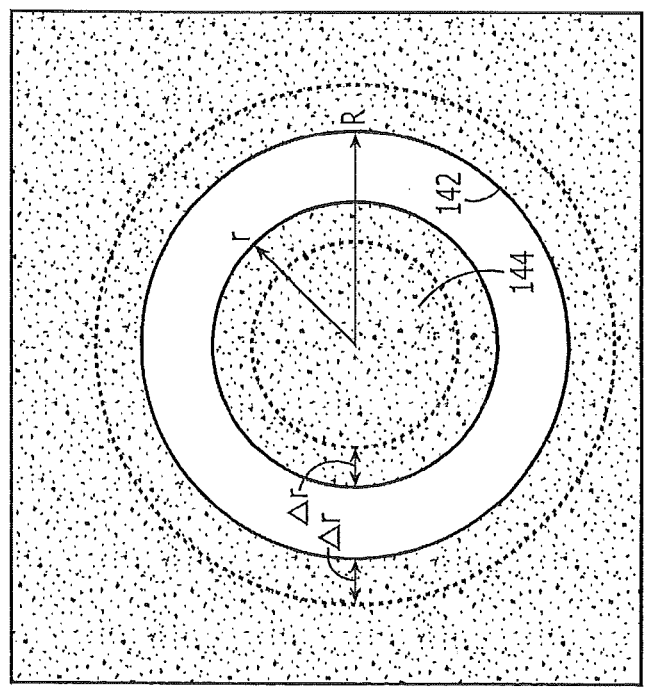
FIG. 8A
FIG. 8B

METHODS OF FORMING MICRO-ELECTROMECHANICAL RESONATORS HAVING PASSIVE TEMPERATURE COMPENSATION REGIONS THEREIN

REFERENCE TO PRIORITY APPLICATION

This application is a divisional of U.S. application Ser. No. 13/035,148, filed Feb. 25, 2011, now U.S. Pat. No. 8,501,515, the disclosure of which is hereby incorporated herein by reference.

FIELD OF THE INVENTION

The present invention relates to methods of forming electromechanical devices and, more particularly, to methods of forming micro-electromechanical resonators.

BACKGROUND OF THE INVENTION

Micro-electromechanical (MEMs) resonators can provide small form factor, ease of integration with conventional semiconductor fabrication techniques and high f·Q products. High frequency and high-Q width-extensional mode silicon bulk acoustic resonators (SiBARs) and film bulk acoustic wave resonators (FBARs) have demonstrated atmospheric Q factors in excess of 10,000 at or above 100 MHz, with moderate motional resistances. Such resonators are disclosed in an article by S. Pourkamali et al., entitled "Low-Impedance VHF and UHF Capacitive Silicon Bulk Acoustic Wave Resonators—Part I: Concept and Fabrication," IEEE Trans. On Electron Devices, Vol. 54, No. 8, pp. 2017-2023, August (2007), the disclosure of which is hereby incorporated herein by reference.

The resonance frequency of silicon micro-electromechanical resonators is dependent on the physical dimensions of the resonating structure. This causes the resonance frequency of those resonators to deviate from a designed target value in response to variations in photolithography, etching and film thickness. For example, as described in an article by G. Casinovi et al., entitled "Analytical Modeling and Numerical Simulation of Capacitive Silicon Bulk Acoustic Resonators," IEEE Intl. Conf. on Micromechanical Systems (2009), a 2 μm variation in thickness of a 100 MHz width—extensional mode SiBAR can cause a 0.5% variation in its center frequency, while lithographic variations of ±0.1 μm in the width of the resonator can cause an additional 0.5% variation in frequency.

Unfortunately, even when efforts to reduce the adverse effects of variations in photolithography, etching and film thickness on resonance frequency are successful, additional changes in resonance frequency may occur in response to changes in operating temperature. These temperature-based changes in resonance frequency can be reduced using modified fabrication processes and active compensation circuits. However, because circuit-based compensation techniques typically increase the complexity and power requirements of resonator devices, passive fabrication-based compensation techniques that are based on the intrinsic properties of the resonator materials are generally preferable to circuit-based compensation techniques. Conventional passive compensation techniques are disclosed in U.S. Patent Publication Nos. 2010/0032789 to Shoen et al., entitled "Passive Temperature Compensation of Silicon MEMS Devices;" and 2009/0160581 to Hagelin et al., entitled "Temperature Stable MEMS Resonator." Additional passive compensation techniques are disclosed in U.S. Pat. No. 7,888,843 to Ayazi et al. and in U.S. Patent Publication Nos. 2010/0319185 to Ayazi et al. and 2010/0194241 to Wang et al., the disclosures of which are hereby incorporated herein by reference.

SUMMARY OF THE INVENTION

Methods of forming electro-micromechanical resonators according to embodiments of the invention utilize techniques to provide passive temperature compensation of semiconductor device layers used therein. According to some of these embodiments of the invention, a first substrate is provided that includes a first electrically insulating temperature compensation layer on a first semiconductor device layer. The first electrically insulating temperature compensation layer may be a silicon dioxide layer and the first semiconductor device layer may be a silicon device layer, however, other electrically insulating and semiconductor materials may also be used having an opposite effect on the overall temperature coefficient of frequency (TCF). A step is performed to bond the first electrically insulating temperature compensation layer to a second substrate containing the second electrically insulating temperature compensation layer therein. A piezoelectric layer is also formed on the first electrically insulating temperature compensation layer and at least a first electrode is formed on the piezoelectric layer.

According to additional embodiments of the invention, the second substrate includes a second semiconductor device layer and the bonding step includes bonding the first electrically insulating temperature compensation layer directly to the second electrically insulating temperature compensation layer. The step of forming the piezoelectric layer may also include forming the piezoelectric layer on a stack of the first and second electrically insulating temperature compensation layers and on the first and second semiconductor device layers. In still further embodiments of the invention, the second substrate may include a buried oxide layer therein and the second semiconductor device layer may extend between the buried oxide layer and the second electrically insulating temperature compensation layer. According to these embodiments of the invention, the piezoelectric layer may be formed on the stack of the first and second electrically insulating temperature compensation layers, the buried oxide layer and the first and second semiconductor device layers.

According to additional embodiments of the invention, one of the first and second substrates may include a semiconductor handling layer (e.g., silicon wafer) and the bonding step may be followed by removing the semiconductor handling layer. In addition, the step of forming a piezoelectric layer may be preceded by a step of forming a second electrode on the first electrically insulating temperature compensation layer so that the piezoelectric layer is sandwiched between the at least a first electrode and the second electrode.

Methods of forming micromechanical resonators according to still further embodiments of the invention include forming a first substrate containing a buried insulating layer, a first semiconductor device layer on the buried insulating layer and a first electrically insulating temperature compensation layer on the first semiconductor device layer. A second electrically insulating temperature compensation layer is bonded directly to the first electrically insulating temperature compensation layer and a piezoelectric layer is formed on a bonded stack of the first and second electrically insulating temperature compensation layers. This second electrically insulating temperature compensation layer may be one layer of a substrate containing a second semiconductor device layer therein. Thereafter, at least a first electrode is formed on the piezoelectric layer. This at least a first electrode may include a pair of interdigitated electrodes in some embodiments of the invention. The piezoelectric layer, the first and second electrically insulating temperature compensation layers and the first semiconductor device layer are selectively etched in sequence to expose the buried insulating layer. At least portion of the buried insulating layer is then removed from the first semiconductor device layer, to thereby define a suspended resonator body which contains a vertically-stacked composite of first portions of the piezoelectric layer, the first and second electrically insulating temperature compensation layers and the first semiconductor device layer. According to additional aspects of these embodiments of the invention, the step of forming a piezoelectric layer can be preceded by a step of forming a second electrode directly on the second electrically insulating temperature compensation layer so that the second electrode is sandwiched between the second electrically insulating temperature compensation layer and the piezoelectric layer.

Methods of forming micromechanical resonators according to additional embodiments of the invention utilize depletion regions within P-N rectifying junctions to provide temperature compensation. According to some of these embodiments of the invention, first and second substrates having first and second semiconductor device layers of first and second conductivity type therein, respectively, are formed prior to bonding the first semiconductor device layer of first conductivity type directly to the second semiconductor device layer of second conductivity type. This direct bond results in the definition of a first P-N rectifying junction (and depletion region) between the first and second semiconductor device layers. A piezoelectric layer is formed on the first rectifying junction and at least a first electrode is formed on the piezoelectric layer. The first substrate may also contain a first electrically insulating temperature compensation layer therein. In these embodiments, the bonding step may be followed by removing a portion of the first substrate to expose the first electrically insulating temperature compensation layer. The piezoelectric layer may be formed on the exposed portion of the first electrically insulating temperature compensation layer. Moreover, in the event the first substrate includes a first buried electrically insulating layer therein, the bonding step may be followed by a step of removing the first buried electrically insulating layer to expose a surface of the first semiconductor device layer. The step of forming a piezoelectric layer may also be preceded by bonding a third semiconductor device layer of second conductivity type to the exposed surface of the first semiconductor device layer to thereby define a second rectifying junction therebetween, which will result in the formation of an additional temperature compensating depletion region.

Methods of forming micro electro-mechanical devices according to still further embodiments of the invention include selectively etching a silicon resonator body layer to define a plurality of perforations therein that extend at least substantially through the resonator body layer and define at least one silicon pillar within each of the plurality of perforations. The plurality of perforations are then filled with silicon dioxide by thermally oxidizing the at least one silicon pillar within each of the plurality of perforations. The step of thermally oxidizing the at least one silicon pillar within each of the plurality of perforations is performed for a sufficient duration to convert each of the silicon pillars to silicon dioxide. The step of selectively etching may also include selectively etching a top surface of the silicon resonator body layer to define a plurality of perforations therein that extend entirely through resonator body layer and expose an electrically insulating layer on a bottom surface of the silicon resonator body layer. In some of these embodiments of the invention, each of the silicon pillars is anchored to a sidewall of a respective one of the plurality of perforations.

BRIEF DESCRIPTION OF THE DRAWINGS

FIGS. 1A-1G are cross-sectional views of intermediate structures that illustrate methods of forming micro-electromechanical resonators according to embodiments of the present invention.

FIG. 3 is a cross-sectional view of an intermediate structure that illustrates methods of forming micro-electromechanical resonators according to embodiments of the present invention.

FIGS. 8A-8B are plan views of silicon resonator body layers that illustrate methods of forming micro-electromechanical resonators according to embodiments of the present invention.

DETAILED DESCRIPTION OF PREFERRED EMBODIMENTS

Figure 1C:
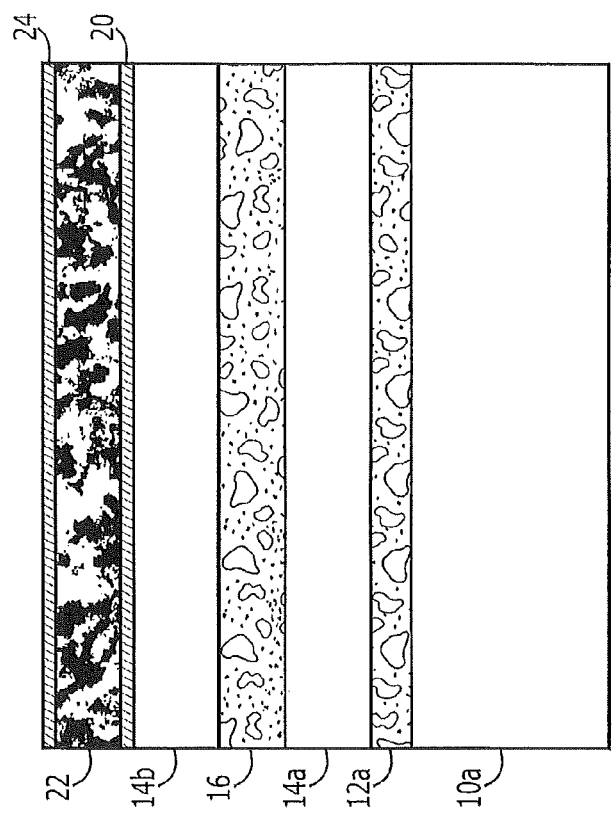

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A illustrates first and second substrates, which are depicted as substrates having an equivalent composite of layers. The first substrate includes a first electrically insulating temperature compensation layer 16a, which may be a silicon oxide layer, on a first semiconductor device layer 14a, which may be a silicon layer. According to some embodiments of the invention, the first electrically insulating temperature compensation layer 16a may have a thickness of about 3 µm. The first electrically insulating temperature compensation layer 16a may be formed by thermally oxidizing a surface of the first semiconductor device layer 14a or by depositing an oxide layer on the surface. This first semiconductor device layer 14a may be provided as an upper layer of a semiconductor-on-insulator (SOI) substrate containing a buried oxide layer 12a and an underlying semiconductor handling layer 10a, which may be formed as a silicon wafer. Similarly, the second substrate includes a second electrically insulating temperature compensation layer 16b on a second semiconductor device layer 14b. The second semiconductor device layer 14b may be provided as an upper layer of a semiconductor-on-insulator (SOI) substrate containing a buried oxide layer 12b and a semiconductor handling layer 10b, which may be formed as a silicon wafer.

Figure 1B:
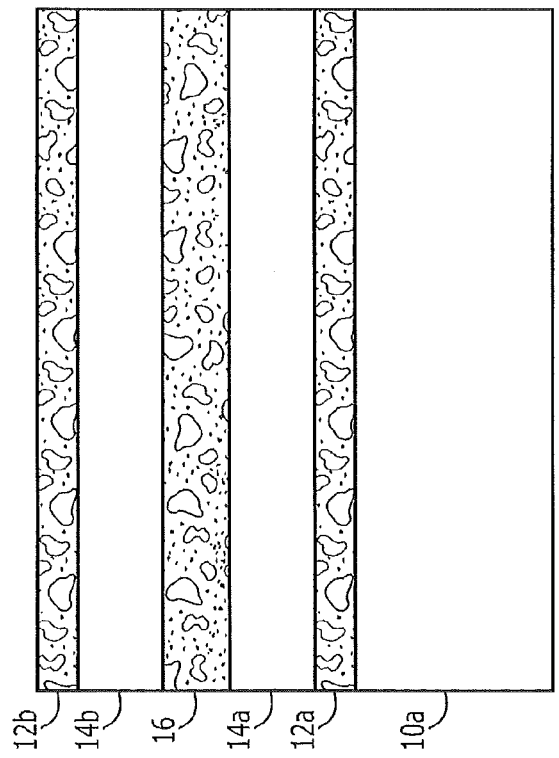

Referring now to FIG. 1B, the first and second substrates may be bonded together to yield a composite electrically insulating temperature compensation layer 16 that is twice as thick as the first and second electrically insulating temperature compensation layers 16a, 16b. This bonding step may be performed by bonding the upper surfaces of the first and second electrically insulating temperature compensation layers 16a, 16b together. This bonding step may utilize a technique such as fusion bonding, which can include a relatively high temperature annealing of the contacting compensation layers (e.g., 1000° C.). After the bonding step, the semiconductor handling layer 10b may be removed to thereby expose the buried oxide layer 12b. As illustrated by FIG. 1C, the buried oxide layer 12b is also removed before deposition of additional materials on the bonded substrates. However, in alternative embodiments of the invention, the buried oxide layer 12b may be maintained to provide additional temperature compensation to the semiconductor device layers 14a, 14b.

Figure 1D:
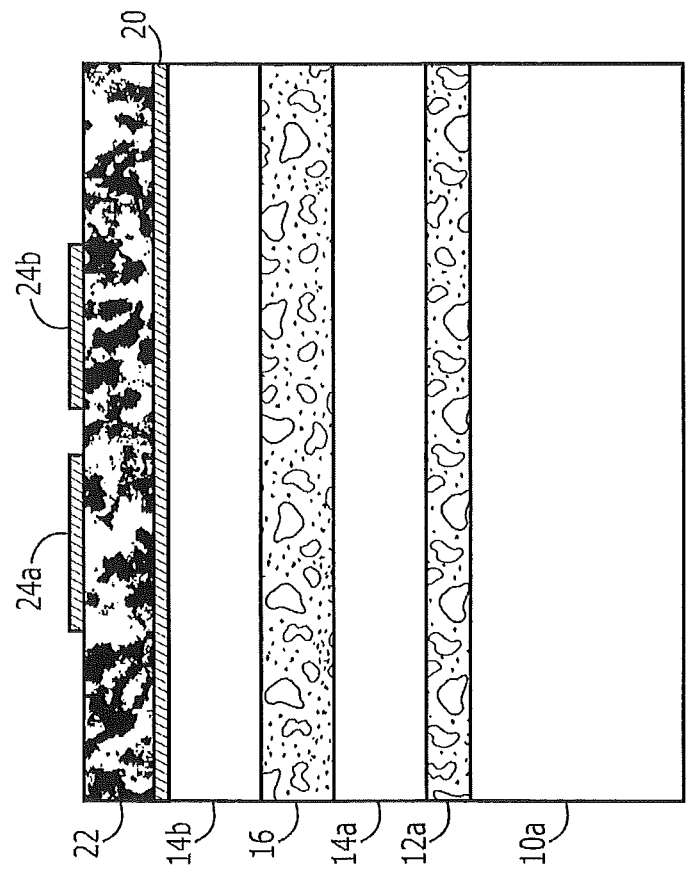

FIGS. 1C-1D illustrate the formation of a second electrode layer 20 (e.g., Mo layer) directly on the second semiconductor device layer 14b, a piezoelectric layer 22 (e.g., AlN layer) on the second semiconductor device layer 14b and a first electrode layer 24 (e.g., Mo layer) directly on the piezoelectric layer 22. This first electrode layer 24 may be patterned to define a pair of electrodes 24a, 24b, which may be configured as input and output electrodes having interdigitated fingers. Examples of micro-electromechanical resonators having interdigitated electrodes are disclosed in U.S. Pat. No. 7,843,284 to Ayazi et al., entitled "Lithographically Defined Multi-Standard Multi-Frequency High-Q Tunable Microelectromechanical Resonators," the disclosure of which is hereby incorporated herein by reference.

Figure 1F:
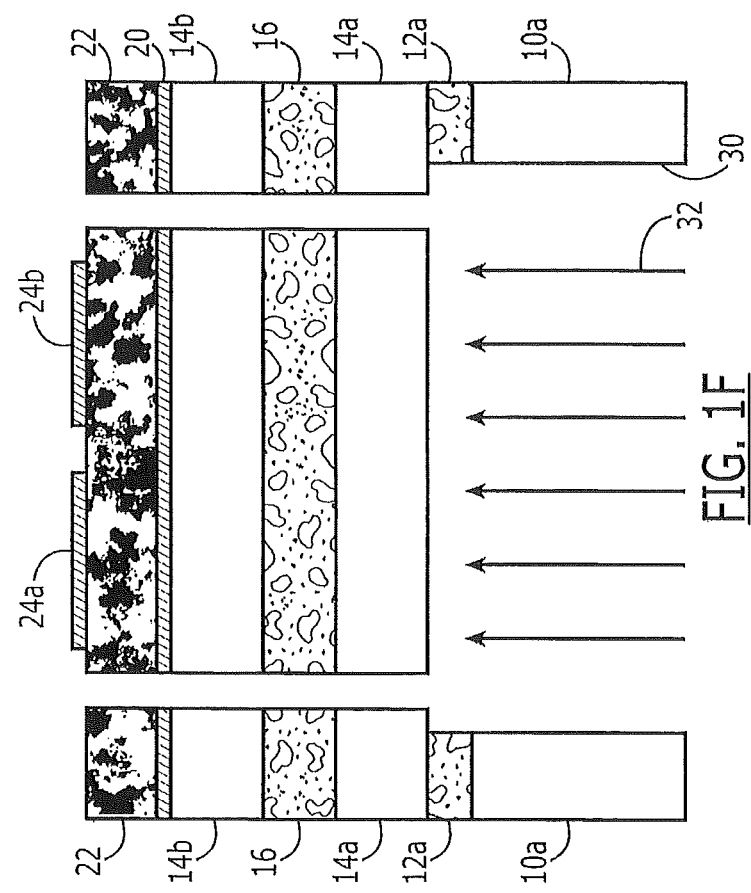
Figure 1G:
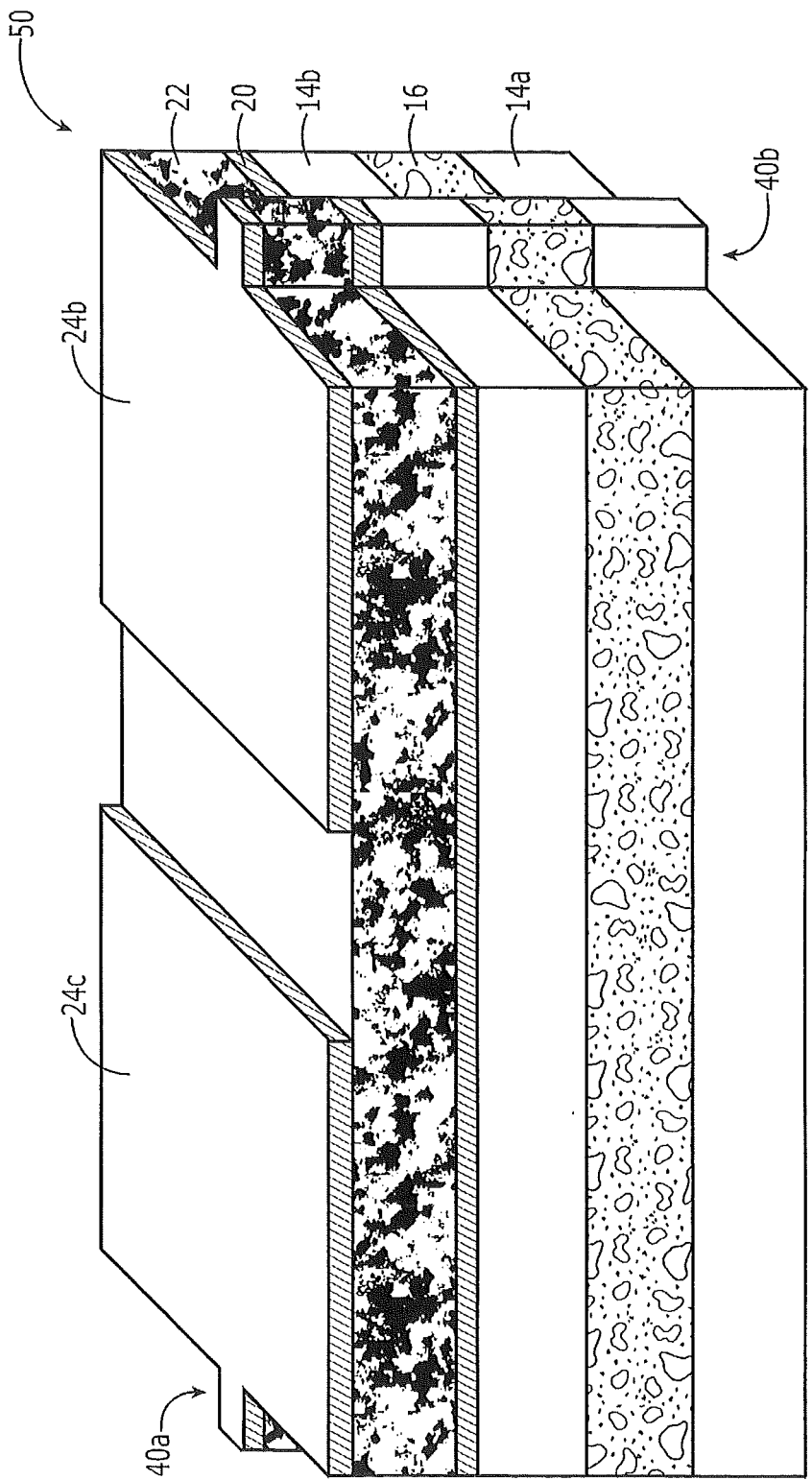

Referring now to FIGS. 1E-1G, the piezoelectric layer 22, the second electrode layer 20, the second semiconductor device layer 14b, the composite electrically insulating temperature compensation layer 16 and the first semiconductor device layer 14a are selectively etched in sequence to expose the buried oxide layer 12a. A selective backside etching step using, for example, deep reactive ion etching 32 (DRIE), may then be performed to remove portions of the semiconductor handling layer 10a and the buried oxide layer 12a in sequence and thereby release the resonator body 50 over a backside recess 30. As illustrated by FIG. 1G, the resonator body 50 may be supported over the backside recess 30 by a pair of supporting tethers 40a, 40b that are attached to a surrounding substrate.

Figure 2A:
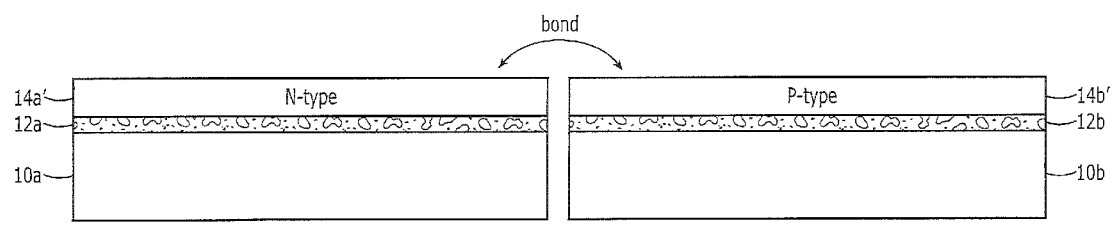
FIGS. 2A-2D are cross-sectional views of intermediate structures that illustrate methods of forming micro-electromechanical resonators according to embodiments of the present invention.
Figure 2B:
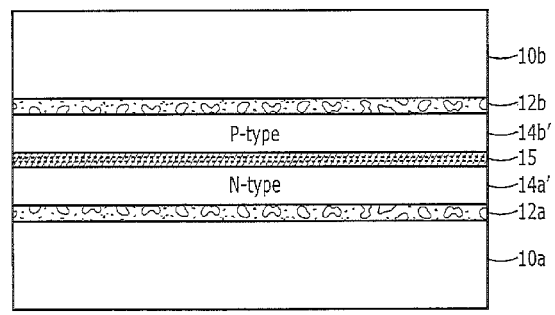
Figure 2D:
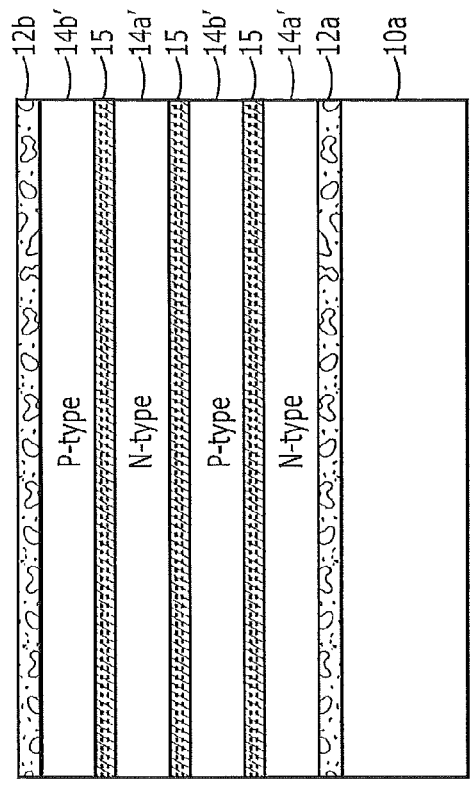
Figure 2C:
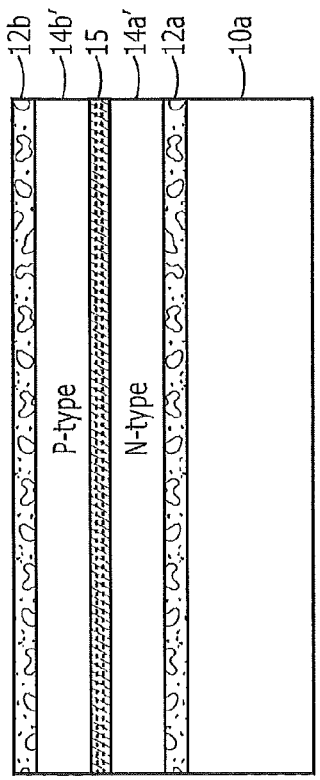

Methods of forming micro-electromechanical resonators according to additional embodiments of the invention are disclosed by FIGS. 2A-2D. As illustrated by FIG. 2A, a first semiconductor-on-insulator (SOI) substrate is illustrated as a stack of layers, including a first N-type semiconductor device layer 14a', a first buried oxide layer 12a and a first semiconductor handling layer 10a. A second semiconductor-on-insulator (SOI) substrate is illustrated as including a second P-type semiconductor device layer 14b', a second buried oxide layer 12b and a second semiconductor handling layer 10b. According to some embodiments of the invention, the first N-type semiconductor device layer 14a' and the second P-type semiconductor device layer 14b' may have thicknesses of a few microns. As illustrated by FIGS. 2B-2C, the first and second SOI substrates may be bonded together prior to removal of the second semiconductor handling layer 10b using such conventional techniques as wafer grinding and deep reactive-ion etching (DRIE). Alternatively, in the event the second semiconductor-on-insulator (SOI) substrate is replaced with a second semiconductor handling layer 10b having a heavily doped P-type layer directly thereon, then KOH etching may be used to remove the second semiconductor handling layer 10b. This removal of the handling layer 10b using KOH etching advantageously uses the heavily doped P-type layer as an etch stop layer, and omits the need for the second buried oxide layer.

As illustrated by FIG. 2B, the bonding of the first N-type semiconductor device layer 14a' directly to the second P-type semiconductor device layer 14b' results in the formation of a depletion region 15, which operates to improve resonator device characteristics by reducing the temperature coefficient of frequency (TCF) associated with the semiconductor device layers 14a', 14b'. These improvements in the TCF characteristics may be further enhanced by forming resonator bodies with multiple depletion regions. In particular, the bonding steps of FIGS. 2A-2C may be repeated multiple times in an alternating sequence of doped layers to yield an SOI substrate comprising multiple depletion regions 15 formed by the alternating sequence of N-type and P-type semiconductor device layers 14a', 14b'. The number of depletion regions achieved with each bonding step may be further increased by using modified semiconductor device layers 14a'', 14b'' containing built-in depletion regions 15' therein, as illustrated by FIG. 3. For example, a first semiconductor device layer 14a'' may be provided as a semiconductor layer having a background N-type doping concentration that is counterdoped at a surface with diffused P-type dopants. Similarly, the second semiconductor device layer 14b'' may be provided as a semiconductor device layer having a background P-type doping concentration that is counterdoped at a surface with diffused N-type dopants. The steps illustrated by FIGS. 2B-2D may then be performed on the substrates of FIG. 3 to thereby achieve a large number of depletion regions within a composite semiconductor device layer.

Figure 4B:
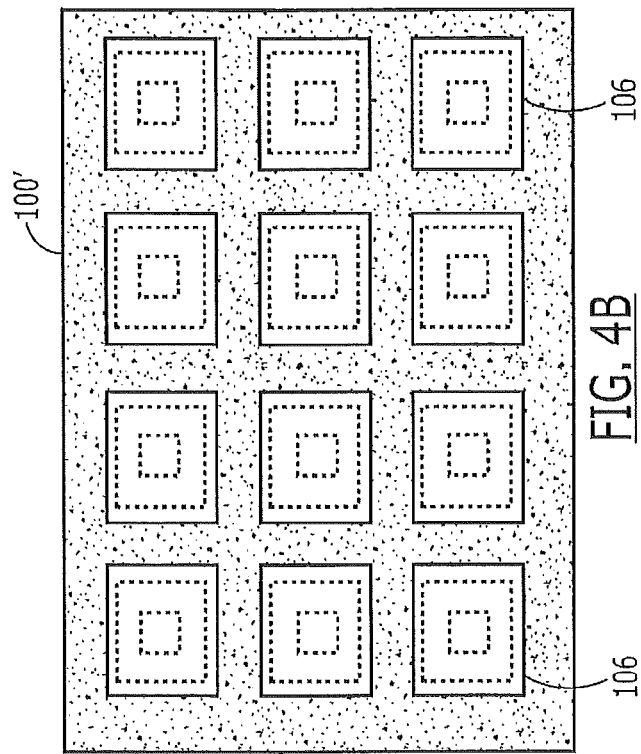
FIGS. 4A-4B are plan views of silicon resonator body layers that illustrate methods of forming micro-electromechanical resonators according to embodiments of the present invention.
Figure 4A:
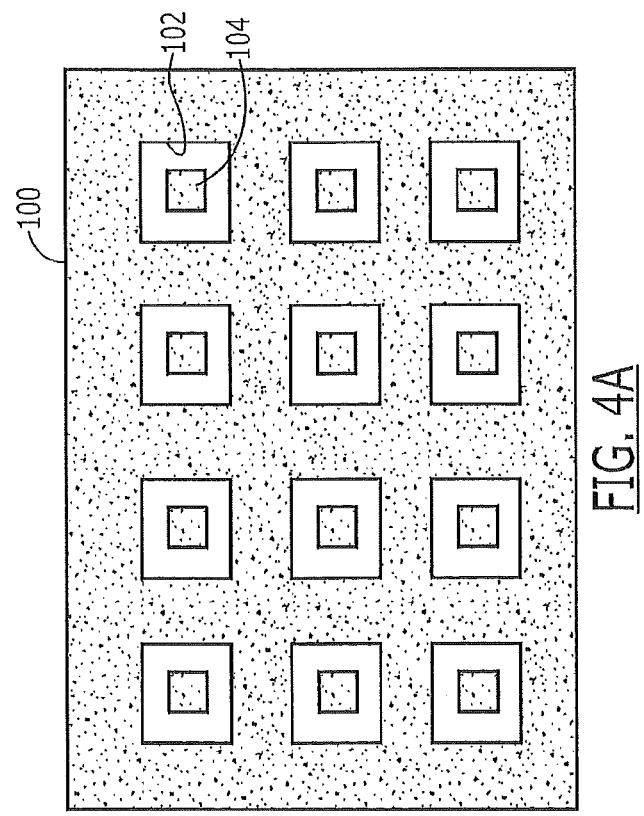

FIG. 4A illustrates a plan view of a silicon resonator body layer 100 having a two-dimensional array of perforations 102 therein that extend at least substantially through the body layer 100. At least one silicon pillar 104 is provided within each of the perforations 102. Examples of techniques for processing micro-electromechanical resonators containing resonator body layers with perforations, including insulator-filled perforations, are disclosed at FIGS. 14A-14B of U.S. Pat. No. 7,888,843 to Ayazi et al., FIGS. 1A-1C of U.S. Patent Publication No. 2010/0319185 to Ayazi et al., and at FIGS. 4A, 5A-5B and 6A-6C of U.S. Patent Publication No. 2010/0194241 to Wang et al., the disclosures of which are hereby incorporated herein by reference. However, in contrast to these published disclosures, the inclusion of silicon pillars 104 within the perforations 102 enhances the properties of the resonator body layer 100 by supporting complete filling of the perforations with electrically insulating material (e.g., silicon oxide) during thermal oxidation of the inner sidewalls of the perforations 102 and complete oxidation of the silicon pillars 104. This electrically insulating material (e.g., thermal oxide) in the "expanded" perforations is identified by the reference numeral 106, within the silicon resonator body layer 100' of FIG. 4B. This resonator body layer 100' (and those described below) may be further processed as described hereinabove and in the aforementioned Ayazi et al. and Wang et al. publications, to thereby yield a micro-electromechanical resonator containing electrodes, a piezoelectric layer and possibly one or more electrically insulating temperature compensation layers in combination with a suspended resonator body that is anchored by tethers to a surrounding substrate. For example, the layers 14a, 14b and 16 in FIG. 1D may be replaced by the resonator body layer 100 in the process flow illustrated by FIGS. 1D-1G.

Figure 5A:
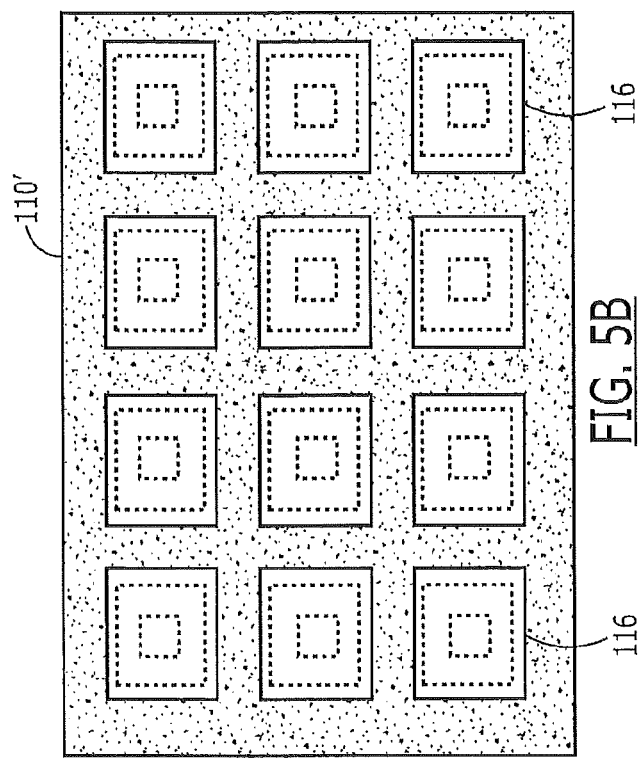
FIGS. 5A-5B are plan views of silicon resonator body layers that illustrate methods of forming micro-electromechanical resonators according to embodiments of the present invention.
Figure 5B:
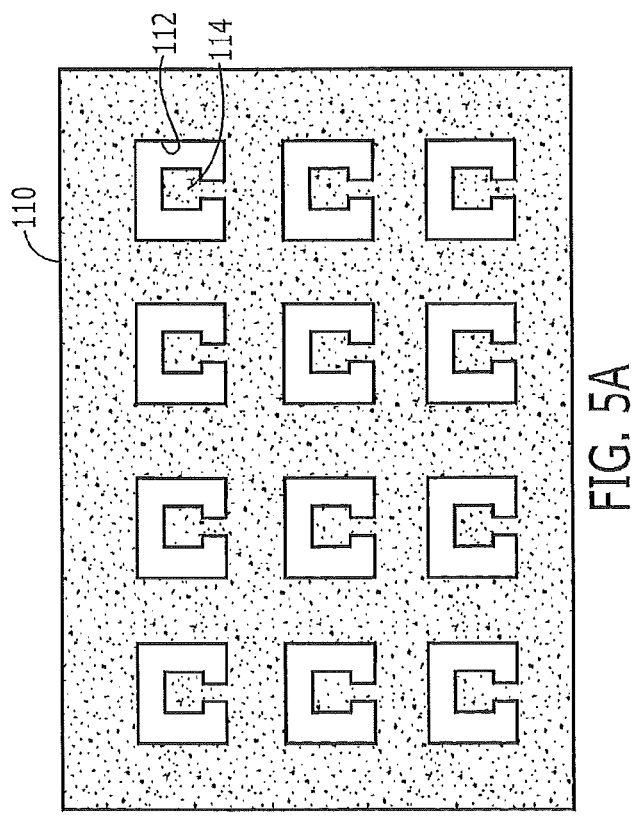
Figure 6A:
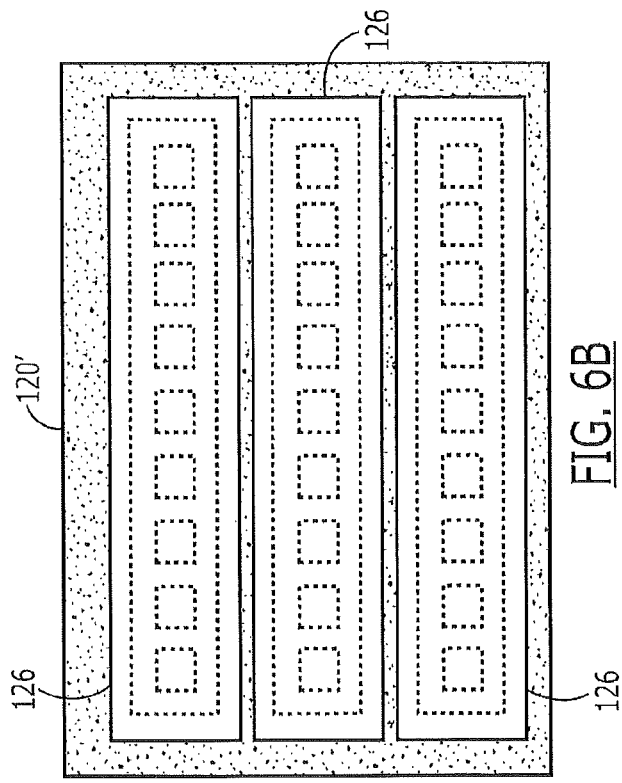
FIGS. 6A-6B are plan views of silicon resonator body layers that illustrate methods of forming micro-electromechanical resonators according to embodiments of the present invention.
Figure 6B:
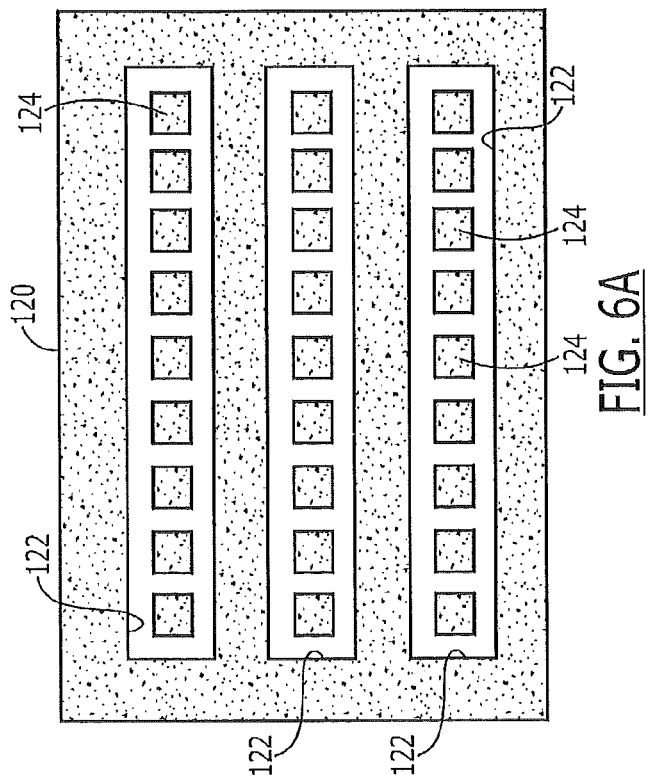
Figures 7A, 7B:
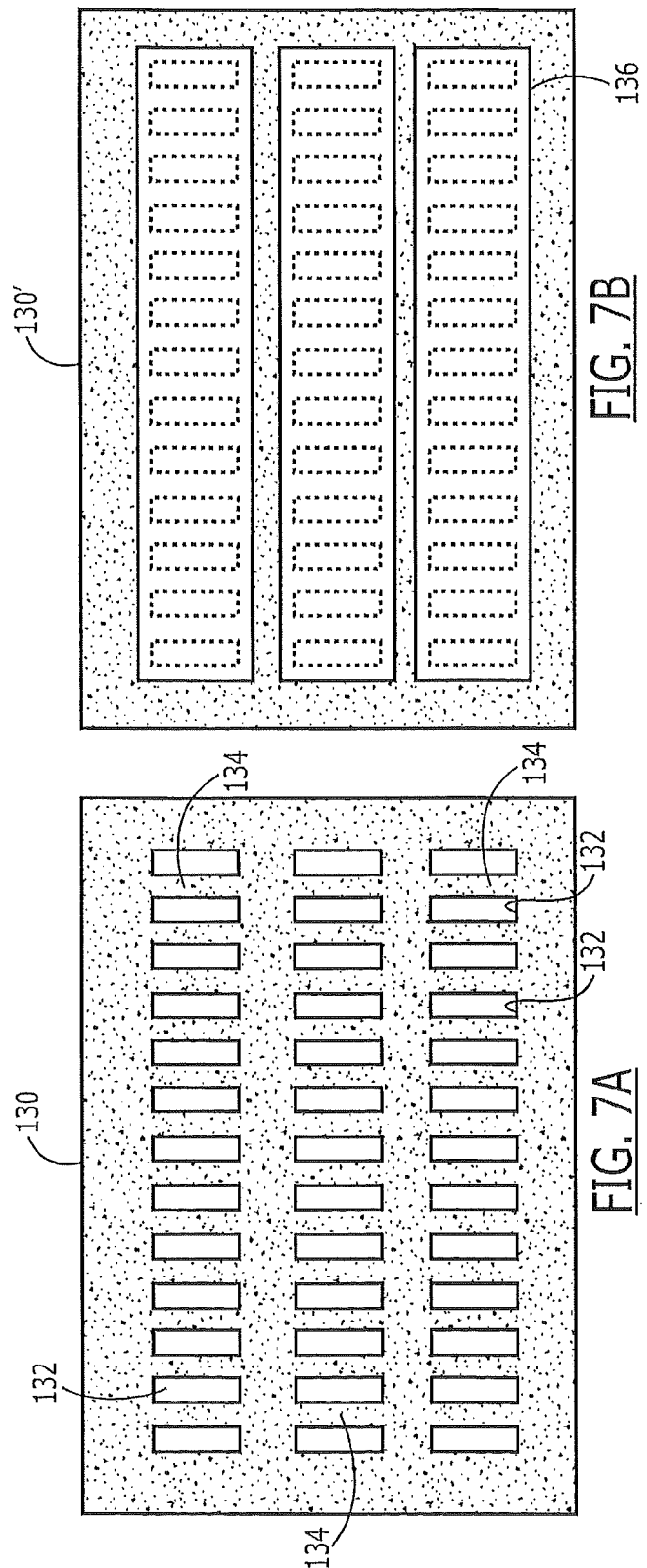
FIGS. 7A-7B are plan views of silicon resonator body layers that illustrate methods of forming micro-electromechanical resonators according to embodiments of the present invention.

FIG. 5A illustrates a silicon resonator body layer 110 having perforations 112 therein that are similar to the perforations 102 of FIG. 4A, however, silicon pillars 114 are provided with anchors to sidewalls of respective perforations 112. These silicon pillars 114 provide the advantage of being able to completely etch through the body layer 110 when there is no underlying support layer (e.g., buried oxide supporting layer). As illustrated by FIG. 5B, the sidewalls of the perforations 112 and the pillars 114 can be thermally oxidized to thereby define insulator-filled perforations 116 within body layer 110'. FIGS. 6A-6B illustrate a silicon resonator body layer 120 having perforations 122 containing multiple silicon pillars 124, which can be thermally oxidized to define relatively large area insulator-filled perforations 126 within a body layer 120'. Similarly, FIGS. 7A-7B illustrate a silicon resonator body layer 130 having perforations 132 containing multiple silicon pillars 134, which can be thermally oxidized to define relatively large area insulator-filled perforations 136 within a body layer 130'.

FIG. 8A illustrates a relatively small portion 140 of a much larger resonator body layer having a circular-shaped perforation 142 therein containing a circular-shaped silicon pillar 144, which may be completely or only partially thermally oxidized during processing. This perforation 142 can be replicated across a resonator body layer in a manner similar to the embodiment of FIG. 5A. As will be understood by those skilled in the art, by using circular-shaped perforations, the total area for thermal oxidation will remain constant even in response to process biases that cause the photolithographically defined dimensions of the perforation and pillar to vary. Assuming the process biases on both sides of the ring-shaped gap between the pillar 144 and the perforation 142 are the same, then the radii of the pillar 144 and perforation 142 will change in opposite directions but the sum of the perimeters of the pillar 144 and perforation 142 will remain the same. This is because the perimeter of the circular-shaped pillar 144 equals $2\pi(r-\Delta r)$, the perimeter of the circular-shaped perforation 142 equals $2\pi(R+\Delta r)$, and the sum of the perimeters is fixed at $2\pi(R+r)$, where $\Delta r$ represents a change in radii caused by fabrication steps prior to thermal oxidation (e.g., process deviations in photolithography and/or etching), as illustrated by FIG. 8A. FIG. 8B illustrates a relatively small portion 140' of a resonator body layer having a generally circular-shaped perforation 142' therein containing a circular-shaped silicon pillar 144' that is anchored by tethers 146 to the surrounding body layer 140' to provide a more stable structure during thermal oxidation.

In the drawings and specification, there have been disclosed typical preferred embodiments of the invention and, although specific terms are employed, they are used in a That which is claimed is:

1. A method of forming a periodic signal generator, comprising:
   forming a microelectromechanical resonator comprising a suspended resonator body having at least two semiconductor layers therein of opposite conductivity type that form a P-N rectifying junction therebetween and a piezoelectric layer on the at least two semiconductor layers.

2. The method of claim 1, wherein said forming comprises bonding the at least two semiconductor layers together to thereby define the P-N rectifying junction at a bonded interface between the at least two semiconductor layers.

3. The method of claim 2, wherein said forming comprises bonding three or more semiconductor layers together to thereby define a plurality of space-apart P-N rectifying junctions at respective interfaces between the three or more semiconductor layers.

4. A method of forming a micromechanical resonator, comprising:
   forming first and second substrates having first and second semiconductor layers of first and second conductivity type therein, respectively, said first substrate comprising a first buried electrically insulating layer therein;
   bonding the first semiconductor layer of first conductivity type to the second semiconductor layer of second conductivity type to thereby define a first rectifying junction therebetween;
   forming a piezoelectric layer on the first rectifying junction; and
   forming at least a first electrode on the piezoelectric layer;
   wherein said bonding is followed by removing the first buried electrically insulating layer to expose a surface of the first semiconductor layer; and wherein said forming a piezoelectric layer is preceded by bonding a third semiconductor layer of second conductivity type to the exposed surface of the first semiconductor layer to thereby define a second rectifying junction therebetween.

5. A method of forming a micromechanical resonator, comprising:
   forming first and second substrates having first and second semiconductor layers of first and second conductivity type therein, respectively;
   bonding the first semiconductor layer of first conductivity type to the second semiconductor layer of second conductivity type to thereby define a first rectifying junction therebetween;
   forming a piezoelectric layer on the first rectifying junction; and
   forming at least a first electrode on the piezoelectric layer.

6. The method of claim 5, wherein the first substrate comprises a first electrically insulating temperature compensation layer therein; wherein said bonding is followed by removing a portion of the first substrate to expose the first electrically insulating temperature compensation layer; and wherein said forming a piezoelectric layer comprises forming a piezoelectric layer on the first electrically insulating temperature compensation layer.

7. The method of claim 5, further comprising selectively etching the piezoelectric layer, the first semiconductor layer and the second semiconductor layer in sequence to define a resonator body comprising at least a portion of the first rectifying junction.

8. The method of claim 7, wherein the second substrate comprises a second buried electrically insulating layer therein; and wherein said selectively etching comprises selectively etching the piezoelectric layer, the first semiconductor layer and the second semiconductor layer in sequence to expose the second buried electrically insulating layer.

9. The method of claim 8, further comprising removing at least a portion of the exposed second buried electrically insulating layer to define a suspended resonator body.

* * * * *